(12) United States Patent
Watakabe et al.

(10) Patent No.: US 12,538,519 B2
(45) Date of Patent: Jan. 27, 2026

(54) SEMICONDUCTOR DEVICE HAVING AN ETCHING STOPPER LAYER ON A FIRST INSULATION LAYER

(71) Applicant: Magnolia White Corporation, Tokyo (JP)

(72) Inventors: Hajime Watakabe, Tokyo (JP); Masashi Tsubuku, Tokyo (JP); Kentaro Miura, Tokyo (JP); Akihiro Hanada, Tokyo (JP); Takaya Tamaru, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 515 days.

(21) Appl. No.: 17/958,437

(22) Filed: Oct. 3, 2022

(65) Prior Publication Data

US 2023/0108412 A1    Apr. 6, 2023

(30) Foreign Application Priority Data

Oct. 4, 2021 (JP) .................................. 2021-163342

(51) Int. Cl.
*H10D 30/67* (2025.01)
*H01L 21/266* (2006.01)
(Continued)

(52) U.S. Cl.
CPC ....... *H10D 30/6713* (2025.01); *H01L 21/266* (2013.01); *H01L 21/31116* (2013.01);
(Continued)

(58) Field of Classification Search
CPC .......... H10D 30/6713; H10D 30/0314; H10D 30/0321; H10D 30/6723; H10D 30/6729;
(Continued)

(56) References Cited

U.S. PATENT DOCUMENTS 6,144,082 A * 11/2000 Yamazaki ............ H10D 86/441
257/E29.151
2006/0270124 A1* 11/2006 You ........................ H10D 86/60
438/151
(Continued)

FOREIGN PATENT DOCUMENTS

JP    2011-187506 A    9/2011
KR    20210085643 A *  7/2021    ......... H10D 30/6755

OTHER PUBLICATIONS

English translation of KR 2021/0085643 (Year: 2021).*

*Primary Examiner* — William B Partridge
*Assistant Examiner* — David Paul Sedorook
(74) *Attorney, Agent, or Firm* — XSENSUS LLP (57) ABSTRACT

According to one embodiment, a semiconductor device includes a semiconductor layer including a source area, a drain area and a channel area, a first insulating layer, an etching stopper layer located immediately above the channel area and being thinner than the first insulating layer, a second insulating layer provided on the etching stopper layer and being thicker than the first insulating layer, a gate electrode, a third insulating layer which covers the etching stopper layer, the second insulating layer and the gate electrode and covers the first insulating layer immediately above the source area and immediately above the drain area, a source electrode in contact with the source area, and a drain electrode in contact with the drain area.

7 Claims, 5 Drawing Sheets

(51) Int. Cl.
    *H01L 21/311*     (2006.01)
    *H01L 21/3213*    (2006.01)
    *H01L 21/426*     (2006.01)
    *H01L 21/4757*    (2006.01)
    *H10D 30/01*      (2025.01)
    *H10D 99/00*      (2025.01)
(52) U.S. Cl.
    CPC .. *H01L 21/31144* (2013.01); *H01L 21/32135* (2013.01); *H01L 21/32139* (2013.01); *H01L 21/426* (2013.01); *H01L 21/47573* (2013.01); *H10D 30/0314* (2025.01); *H10D 30/0321* (2025.01); *H10D 30/6723* (2025.01); *H10D 30/6729* (2025.01); *H10D 30/6731* (2025.01); *H10D 30/6745* (2025.01); *H10D 30/6755* (2025.01); *H10D 99/00* (2025.01)
(58) Field of Classification Search
    CPC ........... H10D 30/6731; H10D 30/6745; H10D 30/6755; H10D 99/00; H10D 30/031; H10D 30/673; H10D 30/6739; H01L 21/266; H01L 21/31116; H01L 21/31144; H01L 21/32135; H01L 21/32139; H01L 21/426; H01L 21/47573
    See application file for complete search history.

(56)     References Cited

U.S. PATENT DOCUMENTS

2007/0145895 A1*  6/2007  Yamamoto ........... H10K 50/844
                                                      313/512
    2011/0215328 A1*  9/2011  Morosawa ......... H10D 30/6756
                                                    257/E21.411
    2013/0313546 A1* 11/2013  Yu ...................... H10D 30/6755
                                                        438/34
    2015/0303221 A1* 10/2015  Ning ...................... H10D 86/60
                                                         257/72
    2017/0243978 A1*  8/2017  Lee ........................ H10D 62/80

* cited by examiner

SEMICONDUCTOR DEVICE HAVING AN ETCHING STOPPER LAYER ON A FIRST INSULATION LAYER

CROSS-REFERENCE TO RELATED APPLICATIONS

This application is based upon and claims the benefit of priority from Japanese Patent Application No. 2021-163342, filed Oct. 4, 2021, the entire contents of which are incorporated herein by reference.

FIELD

Embodiments described herein relate generally to a semiconductor device and a manufacturing method thereof.

BACKGROUND

In recent years, various semiconductor devices comprising a transistor using an oxide semiconductor have been suggested. For example, a technique of applying an oxide semiconductor having a stacked structure of an amorphous film and a crystallized film and providing an etching stopper layer immediately above a gate electrode has been known.

In this type of transistor, for example, a high voltage of 30 V or higher could be applied to the gate electrode. The semiconductor device is required to obtain stable transistor characteristics even when high voltage is applied to the gate electrode.

DETAILED DESCRIPTION

In general, according to one embodiment, a semiconductor device comprises an insulating substrate, a semiconductor layer provided above the insulating substrate, and comprising a source area, a drain area, and a channel area in which a resistance is higher than resistances of the source area and the drain area, a first insulating layer which covers the semiconductor layer, an etching stopper layer provided on the first insulating layer, located immediately above the channel area, and being thinner than the first insulating layer, a second insulating layer provided on the etching stopper layer and being thicker than the first insulating layer, a gate electrode provided on the second insulating layer, a third insulating layer which covers the etching stopper layer, the second insulating layer and the gate electrode and covers the first insulating layer immediately above the source area and immediately above the drain area, a source electrode which is in contact with the source area in a first contact hole penetrating the first insulating layer and the third insulating layer, and a drain electrode which is in contact with the drain area in a second contact hole penetrating the first insulating layer and the third insulating layer.

According to another embodiment, a manufacturing method of a semiconductor device comprises forming a semiconductor layer, a first insulating layer, an etching stopper layer, a second insulating layer and a metal layer above an insulating substrate in series, forming a patterned resist on the metal layer, etching the metal layer using the resist to form a gate electrode, etching the second insulating layer using the resist to partly expose an upper surface of the etching stopper layer, etching the etching stopper layer to partly expose an upper surface of the first insulating layer, and implanting ions into the semiconductor layer via the first insulating layer using the gate electrode as a mask.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

The semiconductor device 1 of the present embodiment can be applied to various display devices such as a liquid crystal display device, an organic electroluminescent display device, an electrophoresis display device and an LED display device, various sensors such as a capacitive sensor and an optical sensor, and other electronic devices.

Figure 1:
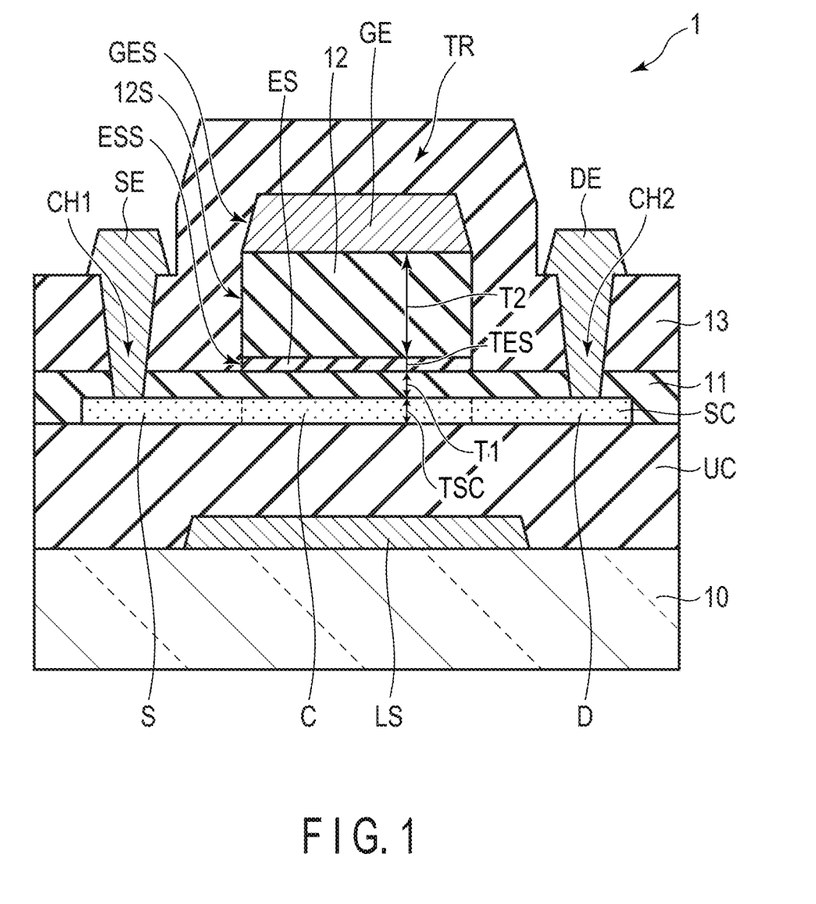
FIG. 1 is a cross-sectional view showing an example of a semiconductor device 1 according to an embodiment.

FIG. 1 is a cross-sectional view showing an example of a semiconductor device 1 according to an embodiment.

The semiconductor device 1 comprises an insulating substrate 10, a light-shielding layer LS, an undercoat layer UC, a first insulating layer 11, a second insulating layer 12, a third insulating layer 13, an etching stopper layer ES and a transistor TR. FIG. 1 shows a single transistor TR included in the semiconductor device 1. The transistor TR comprises a semiconductor layer SC, a gate electrode GE, a source electrode SE and a drain electrode DE.

The insulating substrate 10 is formed of an insulating material such as glass or a resinous film. The insulating substrate 10 may be referred to as a transparent substrate. The light-shielding layer LS is provided on the insulating substrate 10. The light-shielding layer LS is, for example, a metal layer. However, the light-shielding layer LS may be an insulating layer. When the light-shielding layer LS is a metal layer, the light-shielding layer LS may be electrically connected to the gate electrode GE.

The undercoat layer UC is an insulating layer and covers the insulating substrate 10 and the light-shielding layer LS. The undercoat layer UC may be either a single-layer body or a stacked layer body. For example, the undercoat layer UC is a stacked layer body of a silicon oxide layer and a silicon nitride layer.

The semiconductor layer SC is provided on the undercoat layer UC. The semiconductor layer SC comprises a channel area C, a source area S and a drain area D. The channel area C is an area in which the resistance is higher than that of the source area S and the drain area D.

The first insulating layer 11 covers the undercoat layer UC and the semiconductor layer SC. The etching stopper layer ES is located immediately above the channel area C and is provided on the first insulating layer 11. The etching stopper layer ES is not provided immediately above the source area S or immediately above the drain area D.

The second insulating layer 12 is provided on the etching stopper layer ES. Thus, the second insulating layer 12 is located immediately above the channel area C and stacked in the etching stopper layer ES. However, the second insulating layer 12 is not provided immediately above the source area S or immediately above the drain area D. A side surface 12S of the second insulating layer 12 is located immediately above a side surface ESS of the etching stopper layer ES. In the figure, the side surface 12S is substantially perpendicular to the insulating substrate 10. However, the side surface 12S may be an inclined surface.

The gate electrode GE is provided on the second insulating layer 12. Thus, the gate electrode GE is located immediately above the channel area C and is stacked in the second insulating layer 12. A side surface GES of the gate electrode GE is located immediately above the side surface 12S of the second insulating layer 12. In the figure, the side surface GES is shown as an inclined surface. However, the side surface GES may be formed to be substantially perpendicular to the insulating substrate 10. In this regard, to prevent the break of the third insulating layer 13, the side surface GES should be preferably an inclined surface.

The third insulating layer 13 covers the etching stopper layer ES, the second insulating layer 12 and the gate electrode GE. The third insulating layer 13 is in contact with the side surface ESS, the side surface 12S and the side surface GES. The third insulating layer 13 covers the first insulating layer 11 located immediately above the source area S and the first insulating layer 11 located immediately above the drain area D. Thus, the third insulating layer 13 is directly stacked in the first insulating layer 11 immediately above the source area S and immediately above the drain area D.

The source electrode SE is in contact with the source area S in a first contact hole CH1 penetrating the first insulating layer 11 and the third insulating layer 13. The drain electrode DE is in contact with the drain area D in a second contact hole CH2 penetrating the first insulating layer 11 and the third insulating layer 13.

Now, this specification explains the relationships of the thicknesses of the layers.

The etching stopper layer ES is thinner than the first insulating layer 11. In other words, thickness TES of the etching stopper layer ES between the first insulating layer 11 and the second insulating layer 12 is less than thickness T1 of the first insulating layer 11 between the semiconductor layer SC and the etching stopper layer ES (T1>TES).

The etching stopper layer ES is thinner than the semiconductor layer SC. In other words, thickness TES of the etching stopper layer ES is less than thickness TSC of the semiconductor layer SC between the undercoat layer UC and the first insulating layer 11 (TSC>TES).

The second insulating layer 12 is thicker than the first insulating layer 11. Thus, thickness T2 of the second insulating layer 12 between the etching stopper layer ES and the gate electrode GE is greater than thickens T1 of the first insulating layer 11 (T2>T1). For example, thickness T2 is greater than or equal to 1.2 times thickness T1, and could be greater than or equal to 1.5 times thickness T1.

Now, this specification more specifically explains each layer.

The semiconductor layer SC is an oxide semiconductor layer or a polycrystalline silicon layer. Thickness TSC of the semiconductor layer SC is, for example, 50 to 60 nm.

The resistances of the source area S and the drain area D are made low by implanting impurity ions. In other words, the impurity concentration of each of the source area S and the drain area D is higher than that of the channel area C. In this specification, the impurity concentration may refer to the number of impurities per unit volume. In a case where the semiconductor layer SC is an oxide semiconductor, when the impurity concentration is high, the number of oxygen defects per unit volume is large, or the number of defects per unit volume is large.

It should be noted that the semiconductor layer SC may further comprise a low-resistive area located between the channel area C and the source are S, and a low-resistive area located between the channel area C and the drain area D.

The first insulating layer 11 is a silicon oxide layer. As described later, as ions are implanted into the semiconductor layer SC via the first insulating layer 11, to prevent the increase in the acceleration voltage at the time of ion implantation, the first insulating layer 11 should be preferably thin. However, when the etching stopper layer ES located immediately above the channel area C has a fixed charge, a detrimental effect may be caused to the electrical properties of the transistor TR. Thus, to assure a predetermined gap between the etching stopper layer ES and the semiconductor layer SC, the first insulating layer 11 should be preferably thick. According to the analysis of the inventor, thickness T1 of the first insulating layer 11 should be preferably greater than or equal to 70 nm and less than or equal to 100 nm.

Thickness TES of the etching stopper layer ES is, for example, greater than or equal to 10 nm.

As described later, the etching stopper layer ES has a function of preventing the progress of etching to the first insulating layer 11 when the second insulating layer 12 is etched. Thus, the etching stopper layer ES is formed of a material which is resistant to an etching gas when the second insulating layer 12 is etched. For example, the etching stopper layer ES may be formed of an insulating material such as aluminum oxide or a metal material such as aluminum. Since the above materials have a property to block out hydrogen and moisture, the etching stopper layer ES also functions as a shielding layer against hydrogen and moisture.

The second insulating layer 12 is, for example, a single-layer body of silicon oxide. Thickness T2 of the second insulating layer 12 is, for example, greater than or equal to 100 nm and less than or equal to 200 nm. Thickness T2 is set based on the maximum voltage which could be applied to the gate electrode GE. The higher the gate voltage is, the greater thickness T2 is set. Thus, thickness T2 could exceed 200 nm.

When the semiconductor layer SC is an oxide semiconductor layer, it is preferable that the second semiconductor layer 12 should not contain silicon nitride which could be the supply source of hydrogen. However, when the etching stopper layer ES functions as a shielding layer against hydrogen as described above, the second insulating layer 12 may be a single-layer body of silicon nitride.

The gate electrode GE, the source electrode SE and the drain electrode DE are formed of, for example, a metal material such as aluminum (Al), titanium (Ti), molybdenum (Mo), tungsten (W), silver (Ag), copper (Cu) or chrome (Cr), or an alloy prepared by combining these metal materials.

The third insulating layer 13 is, for example, a silicon nitride layer. Since the side surface GES of the gate electrode GE is an inclined surface, the crack of the third insulating layer 13 is prevented.

In the transistor TR described above, the low-resistive source area S, the low-resistive drain area D and the high-resistive channel area C can be formed by implanting ions into the semiconductor layer SC via the first insulating layer 11 using the gate electrode GE as a mask. At this time, thickness T1 of the first insulating layer 11 is restricted to a thickness which allows ion implantation into the semiconductor layer SC with the general acceleration voltage. For example, when thickness T1 is 100 nm, the acceleration voltage for implanting boron (B) is 30 KeV, and the acceleration voltage for implanting phosphorus (P) is 70 KeV. Thus, ion implantation can be conducted with acceleration voltage in a range which can be applied in the current manufacturing device. In addition, the in-plane distribution of the implanted impurities can be made uniform.

In the above transistor TR, the first insulating layer 11 and the second insulating layer 12 practically function as gate insulating films. As described above, thickness T1 of the first insulating layer 11 is restricted by the acceleration voltage when ions are implanted. However, thickness T2 of the second insulating layer 12 is not restricted by acceleration voltage. Thus, by increasing thickness T2 of the second insulating layer 12, the gate insulating film is made thick, and the resistance to voltage can be high regarding a high voltage which could be applied to the gate electrode GE. In this way, for example, even when a high voltage of 30 V or higher is applied to the gate electrode GE, stable transistor characteristics can be obtained, thereby preventing the decrease in reliability.

Figure 2:
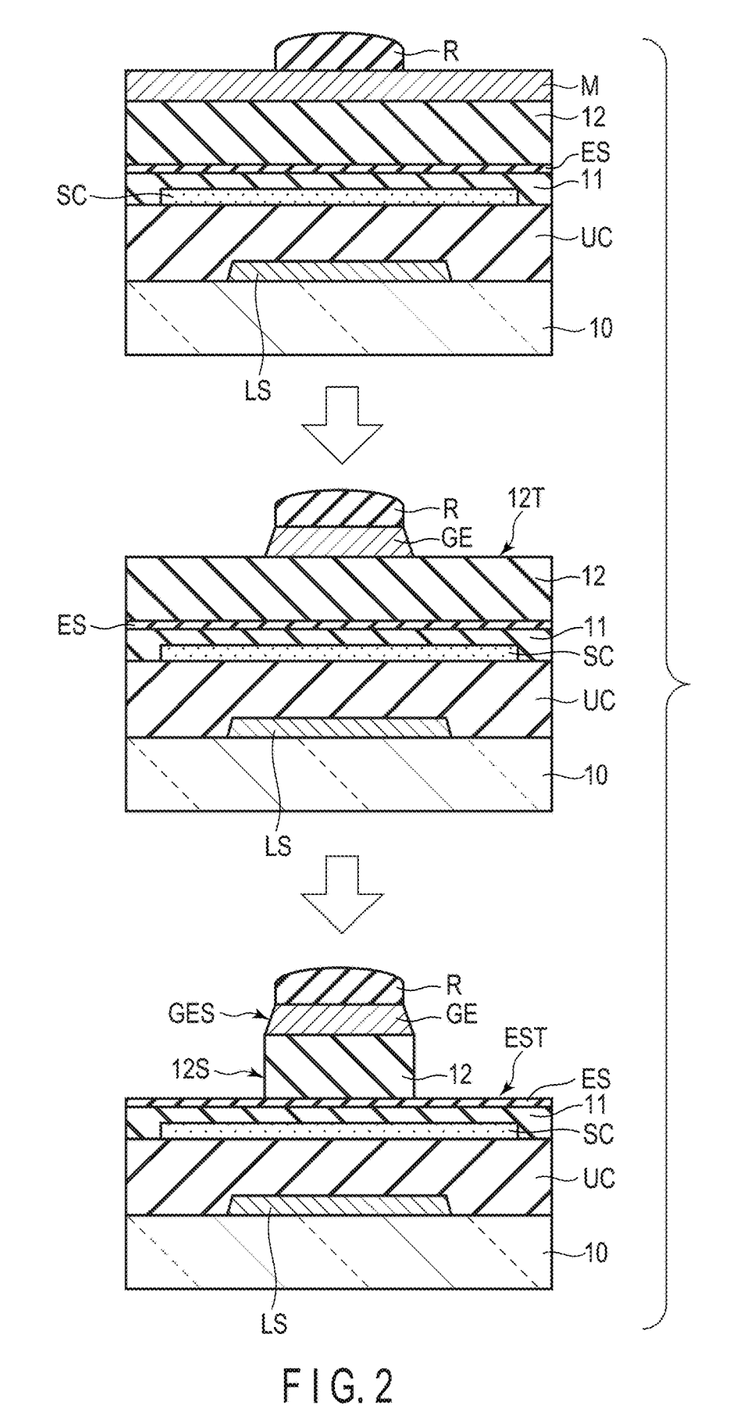
FIG. 2 is a diagram for explaining a manufacturing method of the semiconductor device 1.
Figure 3:
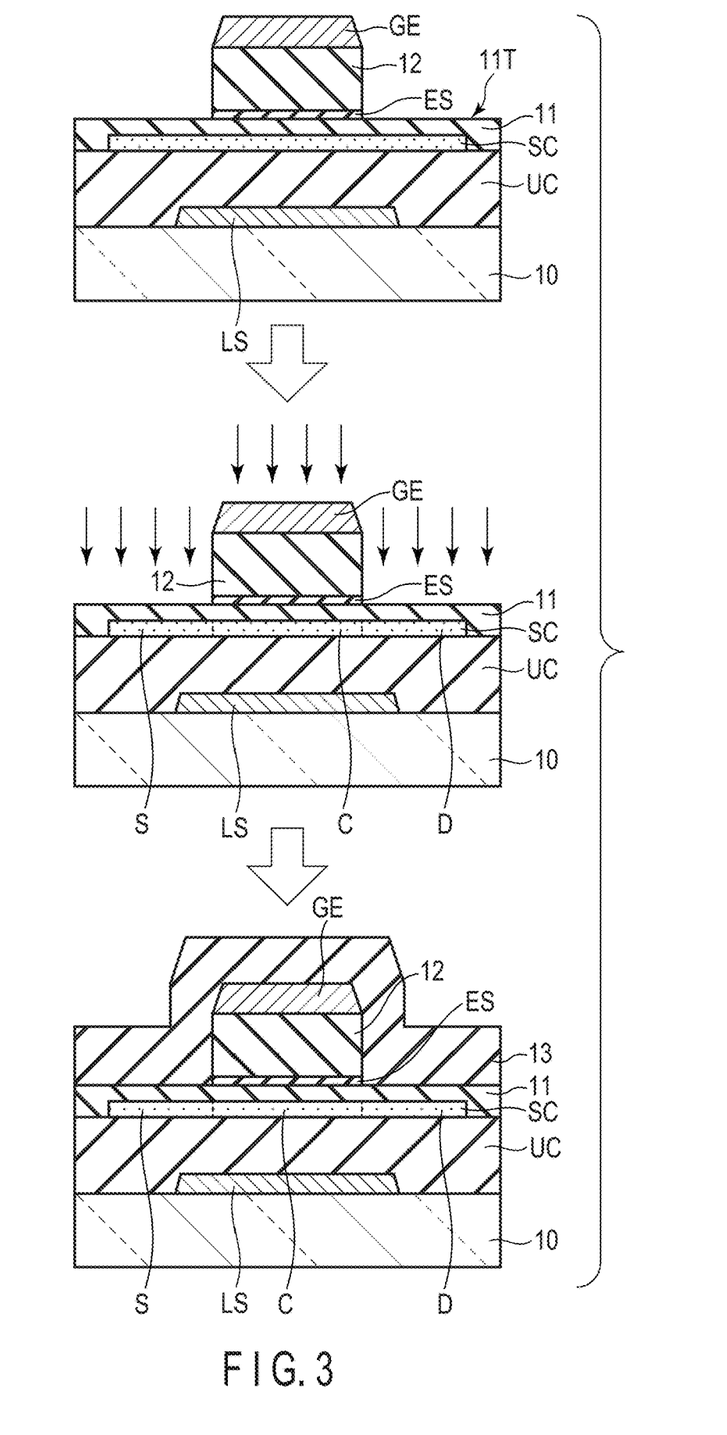
FIG. 3 is a diagram for explaining the manufacturing method of the semiconductor device 1.
Figure 4:
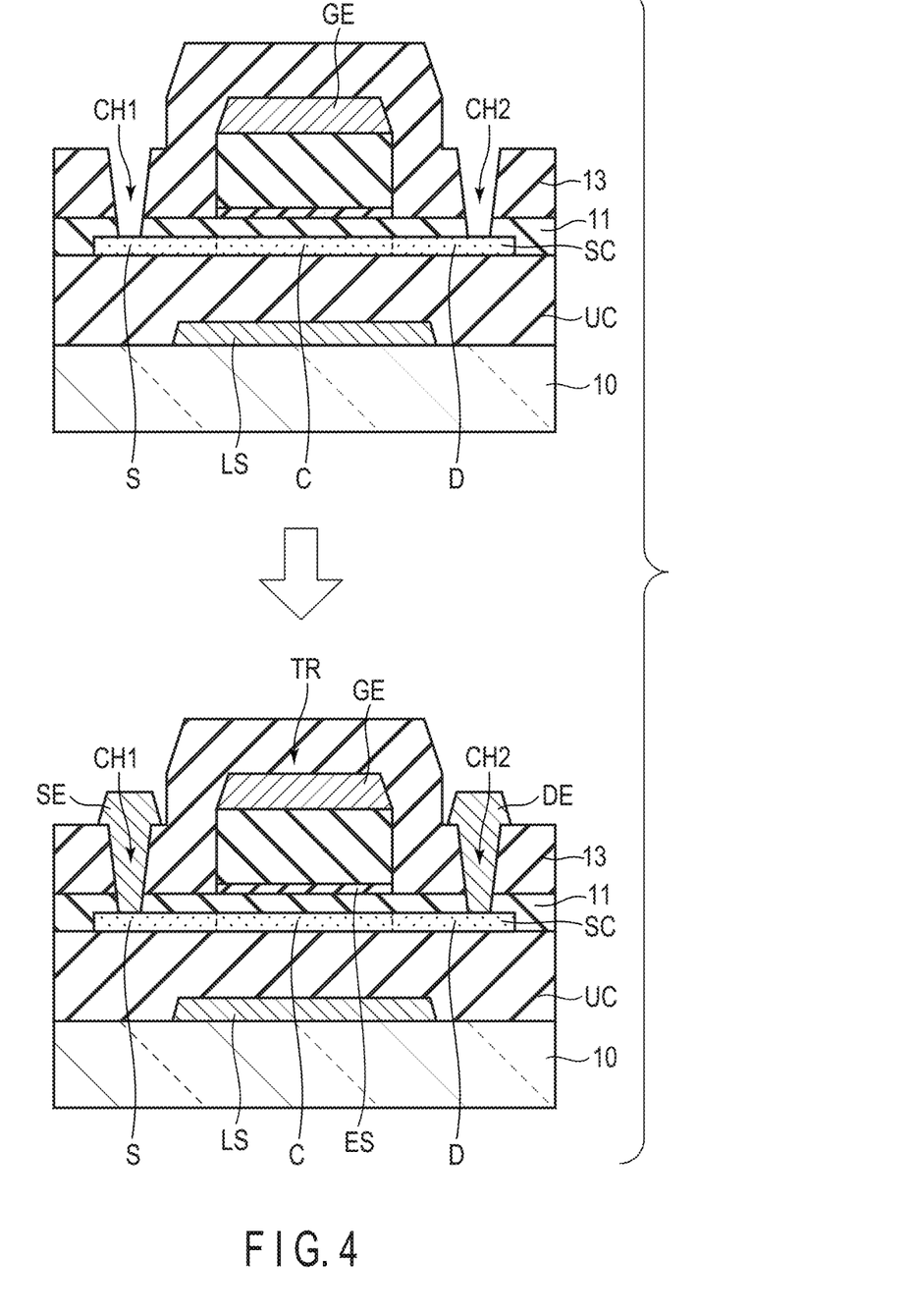
FIG. 4 is a diagram for explaining the manufacturing method of the semiconductor device 1.

Now, this specification explains a manufacturing method of the above semiconductor device 1 with reference to FIG. 2 to FIG. 4.

As shown in the upper stage of FIG. 2, the patterned light-shielding layer LS is formed on the insulating substrate 10, and subsequently, the undercoat layer UC is formed. Subsequently, the patterned semiconductor layer SC is formed on the undercoat layer UC. Subsequently, the first insulating layer 11, the etching stopper layer ES, the second insulating layer 12 and a metal layer M are formed in series. Subsequently, a resist R patterned into a predetermined shape (in other words, a shape corresponding to the gate electrode GE) is formed on the metal layer M.

Subsequently, as shown in the middle stage of FIG. 2, the metal layer M is etched (dry-etched) using the resist R as a mask such that the upper surface 12T of the second insulating layer 12 is partly exposed. In this way, the gate electrode GE is formed.

When the metal layer M is formed of a molybdenum-based material, for example, a sulfur hexafluoride (SF6) gas can be applied as an etching gas. When the metal layer M is formed of an aluminum-based material, for example, a chlorine-based gas can be applied as an etching gas.

Subsequently, as shown in the lower stage of FIG. 2, the second insulating layer 12 is etched (dry-etched) using the resist R as the mask such that the upper surface EST of the etching stopper layer ES is partly exposed. In this way, the patterned second insulating layer 12 is formed under the gate electrode GE.

When the second insulating layer 12 is a silicon oxide layer, and the etching stopper layer ES is formed of aluminum oxide (AlOx), in a manner that is continuous with the etching of the metal layer M, the second insulating layer 12 can be etched by a sulfur hexafluoride gas which is the same etching gas. In addition, the progress of etching can be stopped in the etching stopper layer ES. Thus, when the metal layer M and the second insulating layer 12 are successively etched using the resist R as the mask, the side surface GES of the gate electrode GE overlaps the side surface 12S of the second insulating layer 12.

Subsequently, as shown in the upper stage of FIG. 3, the etching stopper layer ES is etched (wet-etched) using the gate electrode GE as a mask. In this way, the upper surface 11T of the first insulating layer 11 is partly exposed. Thus, the patterned etching stopper layer ES is formed on the first insulating layer 11.

When the etching stopper layer ES is formed of aluminum oxide, for example, hydrogen fluoride (HF) can be applied as an etchant.

Subsequently, as shown in the middle stage of FIG. 3, ions are implanted into the semiconductor layer SC via the first insulating layer 11 using the gate electrode GE as a mask. By this ion implantation, impurities such as boron (B) and phosphorus (P) are implanted into the semiconductor layer SC via the first insulating layer 11 in which thickness T1 is approximately 100 nm. By this process, the channel area C into which impurities are hardly implanted and the source and drain areas S and D into which impurities are implanted are formed in the semiconductor layer SC.

Subsequently, as shown in the lower stage of FIG. 3, the third insulating layer 13 which covers the first insulating layer 11, the etching stopper layer ES, the second insulating layer 12 and the gate electrode GE is formed.

Subsequently, as shown in the upper stage of FIG. 4, in the first insulating layer 11 and the third insulating layer 13, the first contact hole CH1 which penetrates the layers such that the source area S is exposed and the second contact hole CH2 which penetrates the layers such that the drain area D is exposed are formed.

Subsequently, as shown in the lower stage of FIG. 4, a metal layer is formed on the third insulating layer 13. Subsequently, the metal layer is patterned to form the source electrode SE which is in contact with the source area S in the first contact hole CH1 and the drain electrode DE which is in contact with the drain area D in the second contact hole CH2. By this process, the transistor TR is obtained.

Figure 5:
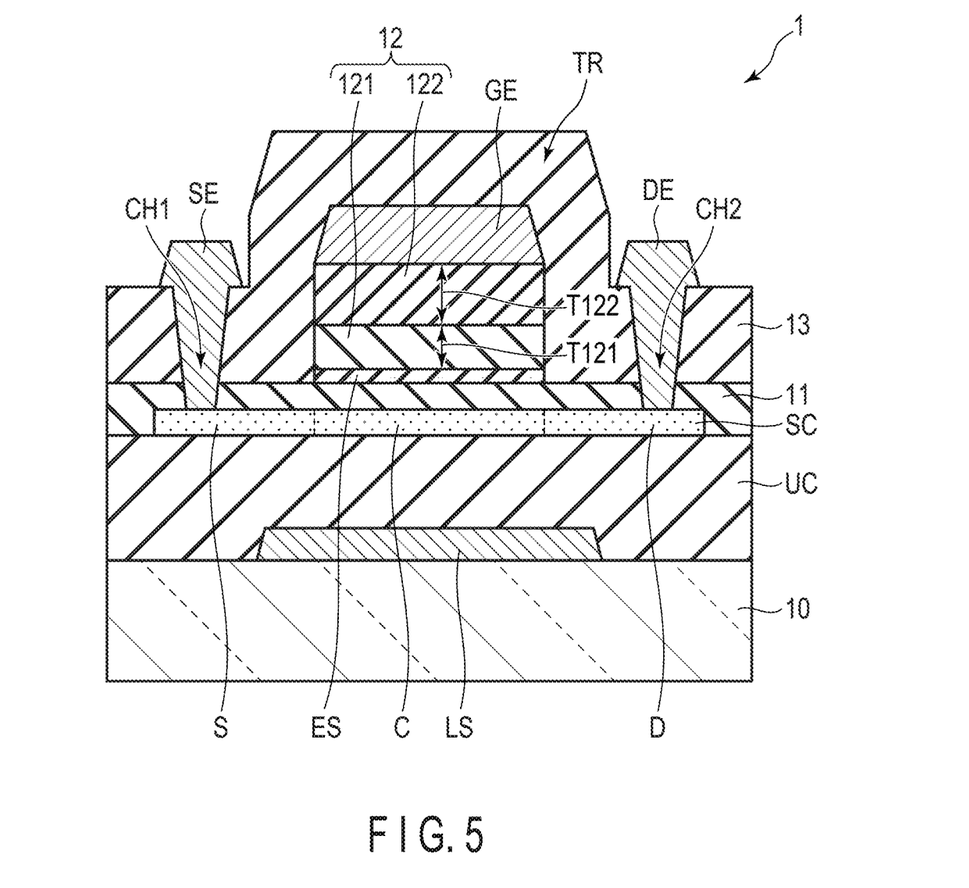
FIG. 5 is a cross-sectional view showing another example of the semiconductor device 1 according to the embodiment.

FIG. 5 is a cross-sectional view showing another example of the semiconductor device 1 according to the embodiment.

The example shown in FIG. 5 is different from the example shown in FIG. 1 in respect that the second insulating layer 12 is a stacked layer body. The second insulating layer 12 shown in FIG. 5 is a stacked layer body consisting of two layers, specifically, a first layer 121 and a second layer 122. The first layer 121 is provided on the etching stopper layer ES and is in contact with the etching stopper layer ES. The second layer 122 is provided on the first layer 121 and is in contact with the first layer 121 and the gate electrode GE. It should be noted that the second insulating layer 12 may be a stacked layer body consisting of three or more layers.

The first layer 121 and the second layer 122 are formed of different insulating materials. For example, the first layer 121 is a silicon nitride layer, and the second layer 122 is a silicon oxide layer. Thickness T121 of the first layer 121 is greater than thickness T122 of the second layer 122.

As described above, since the etching stopper layer ES functions as a shielding layer against hydrogen, even when the second insulating layer 12 includes a silicon nitride layer which could be the supply source of hydrogen, the diffusion of hydrogen into the semiconductor layer SC is prevented.

In the semiconductor device 1 of the example shown in FIG. 5, an effect similar to that of the semiconductor device 1 shown in FIG. 1 can be obtained.

As described above, the present embodiment can provide a manufacturing method such that the manufacturing process of a semiconductor device which prevents the decrease in reliability is simplified.

All of the manufacturing methods of a semiconductor device that can be implemented by a person of ordinary skill in the art through arbitrary design changes to the manufacturing method of a semiconductor device described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A semiconductor device comprising:
   an insulating substrate;
   a semiconductor layer provided above the insulating substrate, and comprising a source area, a drain area, and a channel area in which a resistance is higher than resistances of the source area and the drain area;
   a first insulating layer which covers the semiconductor layer;
   an etching stopper layer provided on the first insulating layer, located immediately above the channel area, and being thinner than the first insulating layer;
   a second insulating layer provided on the etching stopper layer and being thicker than the first insulating layer;
   a gate electrode provided on the second insulating layer;
   a third insulating layer which covers the etching stopper layer, the second insulating layer and the gate electrode and is in contact with the first insulating layer immediately above the source area and immediately above the drain area;
   a source electrode which is in contact with the source area in a first contact hole penetrating the first insulating layer and the third insulating layer, and
   a drain electrode which is in contact with the drain area in a second contact hole penetrating the first insulating layer and the third insulating layer, wherein
   each of the etching stopper layer and the third insulating layer is formed of a material different from the first insulating layer,
   the etching stopper layer is formed of a material different from the second insulating layer,
   the source electrode and the drain electrode are spaced apart from the etching stopper layer,
   the first insulating layer includes a bottom surface and a top surface,
   the bottom surface is in contact with the semiconductor layer,
   the top surface is in contact with the etching stopper layer and the third insulating layer,
   a side surface of the second insulating layer and a side surface of the etching stopper layer are located between the source electrode and the drain electrode, and
   the third insulating layer is in contact with the side surface of the second insulating layer and the side surface of the etching stopper layer.

2. The semiconductor device of claim 1, wherein
   the side surface of the second insulating layer is located immediately above the side surface of the etching stopper layer, and
   a side surface of the gate electrode is located immediately above the side surface of the second insulating layer.

3. The semiconductor device of claim 1, wherein
   the semiconductor layer is an oxide semiconductor layer or a polycrystalline silicon layer, and
   an impurity concentration of each of the source area and the drain area is higher than an impurity concentration of the channel area.

4. The semiconductor device of claim 1, wherein
   a thickness of the first insulating layer is greater than or equal to 70 nm and less than or equal to 100 nm.

5. The semiconductor device of claim 1, wherein
   a thickness of the etching stopper layer is greater than or equal to 10 nm.

6. The semiconductor device of claim 1, wherein
   a thickness of the second insulating layer is greater than or equal to 100 nm.

7. The semiconductor device of claim 1, wherein
   the second insulating layer is a single-layer body of silicon oxide, a single-layer body of silicon nitride or a stacked layer body of a silicon oxide layer and a silicon nitride layer.

* * * * *